United States Patent
Tsubota et al.

(10) Patent No.: US 10,152,010 B2
(45) Date of Patent: Dec. 11, 2018

(54) SIGNAL TRANSMITTING APPARATUS AND IMAGE FORMING APPARATUS

(71) Applicant: FUJI XEROX CO., LTD., Tokyo (JP)

(72) Inventors: Hirokazu Tsubota, Kanagawa (JP); Tsutomu Ishii, Kanagawa (JP); Tsutomu Hamada, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 42 days.

(21) Appl. No.: 15/446,208

(22) Filed: Mar. 1, 2017

(65) Prior Publication Data
US 2018/0067438 A1    Mar. 8, 2018

(30) Foreign Application Priority Data

Sep. 2, 2016  (JP) .................... 2016-172234

(51) Int. Cl.
| | |
|---|---|
| G03G 21/16 | (2006.01) |
| G03G 15/00 | (2006.01) |
| H05K 1/11 | (2006.01) |
| H05K 1/02 | (2006.01) |
| G03G 15/04 | (2006.01) |

(52) U.S. Cl.
CPC ..... G03G 15/5087 (2013.01); G03G 21/1652 (2013.01); H05K 1/0242 (2013.01); H05K 1/0245 (2013.01); H05K 1/0253 (2013.01); H05K 1/115 (2013.01); *G03G 15/04045* (2013.01); *G03G 15/80* (2013.01)

(58) Field of Classification Search
CPC .................................................. G03G 15/5087
USPC ............................................................ 399/4
See application file for complete search history.

(56) References Cited

U.S. PATENT DOCUMENTS

| | | | |
|---|---|---|---|
| 2003/0095036 A1 | 5/2003 | Wasaki et al. | |
| 2015/0016835 A1* | 1/2015 | Kakutani | G03G 21/1604 |
| | | | 399/88 |
| 2015/0230337 A1* | 8/2015 | Kim | H05K 1/118 |
| | | | 361/751 |

FOREIGN PATENT DOCUMENTS

| | | | |
|---|---|---|---|
| JP | 2003-218754 A | 7/2003 | |
| JP | 2004-193711 A | 7/2004 | |
| WO | WO 2010027377 A1 * | 3/2010 | ............... H04N 5/44 |

* cited by examiner

*Primary Examiner* — Quana M Grainger
(74) *Attorney, Agent, or Firm* — Sughrue Mion, PLLC

(57) ABSTRACT

A signal transmitting apparatus includes a first line that is provided in one of plural layers of a board and transmits a signal by superimposing the signal on an electric power line that supplies electric power; a coupling section in which the electric power line is coupled to the first line and the first line is branched; plural second lines that branch off in the coupling section and are provided in another layer different from the one layer; and a conductive layer that is provided between the one layer and the other layer. The conductive layer has an opening that encompasses the coupling section in plan view, and the coupling section has a coupling line that has a larger width than the first line and plural through-holes that connect the coupling line and the plural second lines through the opening of the conductive layer.

3 Claims, 6 Drawing Sheets

SIGNAL TRANSMITTING APPARATUS AND IMAGE FORMING APPARATUS

CROSS-REFERENCE TO RELATED APPLICATIONS

This application is based on and claims priority under 35 USC 119 from Japanese Patent Application No. 2016-172234 filed Sep. 2, 2016.

BACKGROUND

Technical Field

The present invention relates to a signal transmitting apparatus and an image forming apparatus.

SUMMARY

According to an aspect of the invention, there is provided a signal transmitting apparatus including: a first line that is provided in one of plural layers of a board and transmits a signal by superimposing the signal on an electric power line that supplies electric power; a coupling section in which the electric power line is coupled to the first line and the first line is branched; plural second lines that branch off in the coupling section and are provided in another layer different from the one layer; and a conductive layer that is provided between the one layer and the other layer. The conductive layer has an opening that encompasses the coupling section in plan view, and the coupling section has a coupling line that has a larger width than the first line and plural through-holes that connect the coupling line and the plural second lines through the opening of the conductive layer.

BRIEF DESCRIPTION OF THE DRAWINGS

An exemplary embodiment of the present invention will be described in detail based on the following figures, wherein.

DETAILED DESCRIPTION

Figure 1:
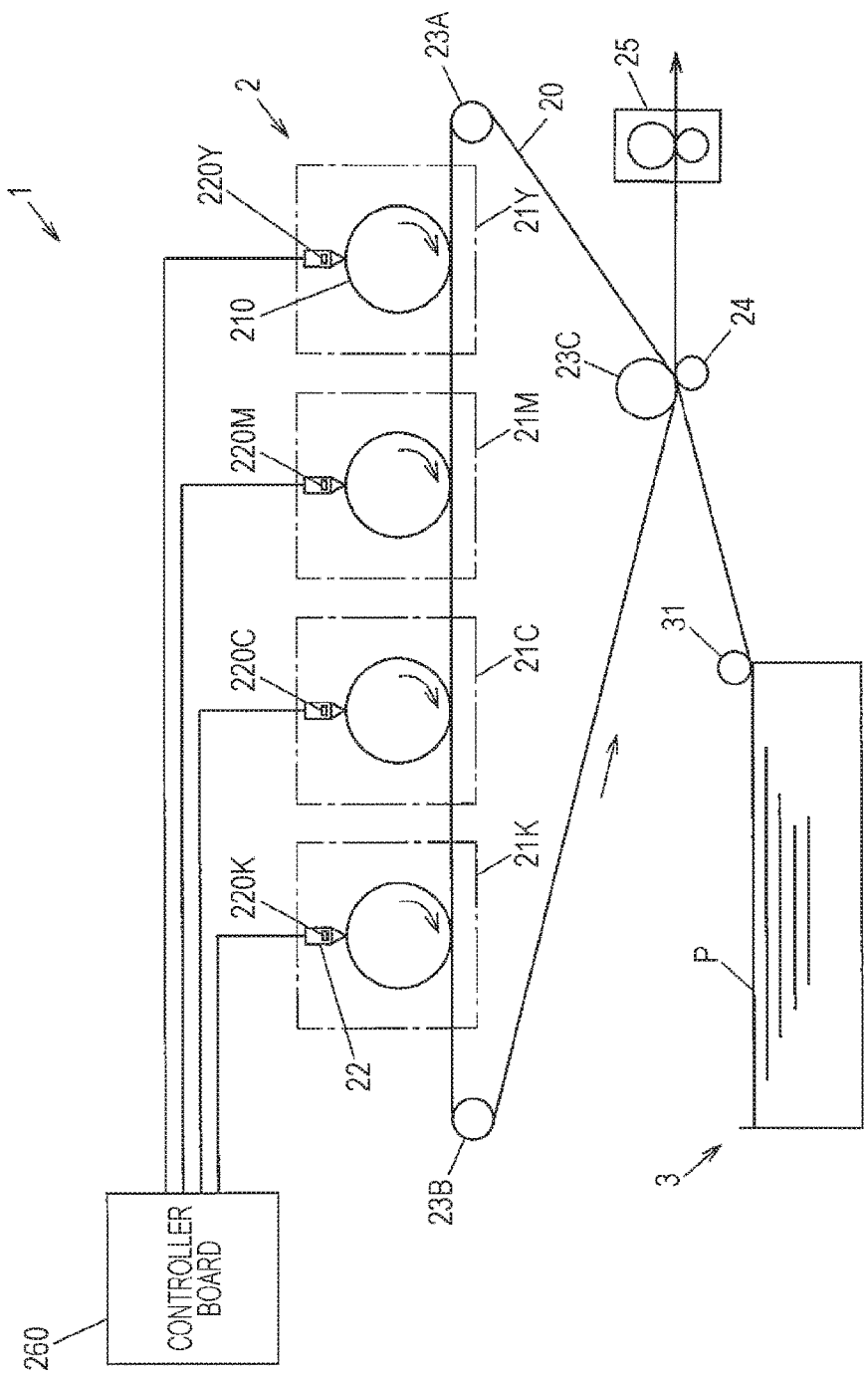
FIG. 1 is a diagram illustrating an example of an outline configuration of an image forming apparatus according to an exemplary embodiment of the present invention.

An exemplary embodiment of the present invention is described below with reference to the drawings. Constituent elements that have substantially the same functions in the drawings are given identical reference signs, and repetitive description thereof is omitted.

FIG. 1 is a diagram illustrating an example of an outline configuration of an image forming apparatus according to an exemplary embodiment of the present invention. This image forming apparatus 1 includes an image reading section (not illustrated) that reads a document image from a document, an image forming section 2 that prints the document image read by the image reading section onto a sheet P, and a tray section 3 from which a sheet P picked up by a pick-up roll 31 is fed to the image forming section 2. The sheet P is an example of a recording medium.

The image forming section 2 prints a document image onto a sheet by electrophotography and includes an endless intermediate transfer belt 20 that circulates, first through fourth image forming units 21Y, 21M, 21C, and 21K for first transfer of yellow (Y), magenta (M), cyan (C), and black (K) toner images onto the intermediate transfer belt 20, and LED printer heads (LPHs) 22 that form electrostatic latent images on photoconductor drums 210 (described later) of the first through fourth image forming units 21Y, 21M, 21C, and 21K by exposing the photoconductor drums 210 to an optical beam modulated on the basis of image data. The LPHs 22 are an example of exposure devices. Not only LPHs, but also scan writing devices that use a laser diode (LD) as a light source, LD arrays each including plural LDs aligned in a first scanning direction, and the like may be used as the exposure devices.

Each of the LPHs 22 includes an LED array including plural light emitting diodes (LEDs) aligned in a first scanning direction, an LED substrate 220Y, 220M, 220C, or 220K (collectively referred to as "LED substrates 220") on which the LED array and an LED driving circuit are mounted, and a lens array that forms an image on the photoconductor drum 210 from an optical beam emitted from the LED array.

Each of the image forming units 21Y, 21M, 21C, and 21K includes the photoconductor drum 210, a charger that uniformly charges a surface of the photoconductor drum 210, a developing device that forms a toner image by developing an electrostatic latent image formed on the surface of the photoconductor drum 210 by the LPH 22 by using toner of a corresponding color, and a first transfer roller that presses the intermediate transfer belt 20 against the photoconductor drum 210.

The intermediate transfer belt 20 is suspended across plural rollers 23A, 23B, and 23C and circulates by torque from any of the rollers 23A, 23B, and 23C.

The image forming section 2 faces the roller 23C with the intermediate transfer belt 20 interposed therebetween and includes a second transfer roller 24 for second transfer of the toner image formed on the intermediate transfer belt 20 onto a sheet P fed from the tray section 3, and a fixing unit 25 that fixes the toner image transferred on the sheet P onto the sheet P.

The image forming section 2 includes an image formation controller 26 (see FIG. 2) that controls an image forming operation. The image formation controller 26 includes a controller board 260 and plural LED substrates 220. The controller board 260 is an example of a signal transmitting apparatus.

Configuration of Image Formation Controller

Figure 2:
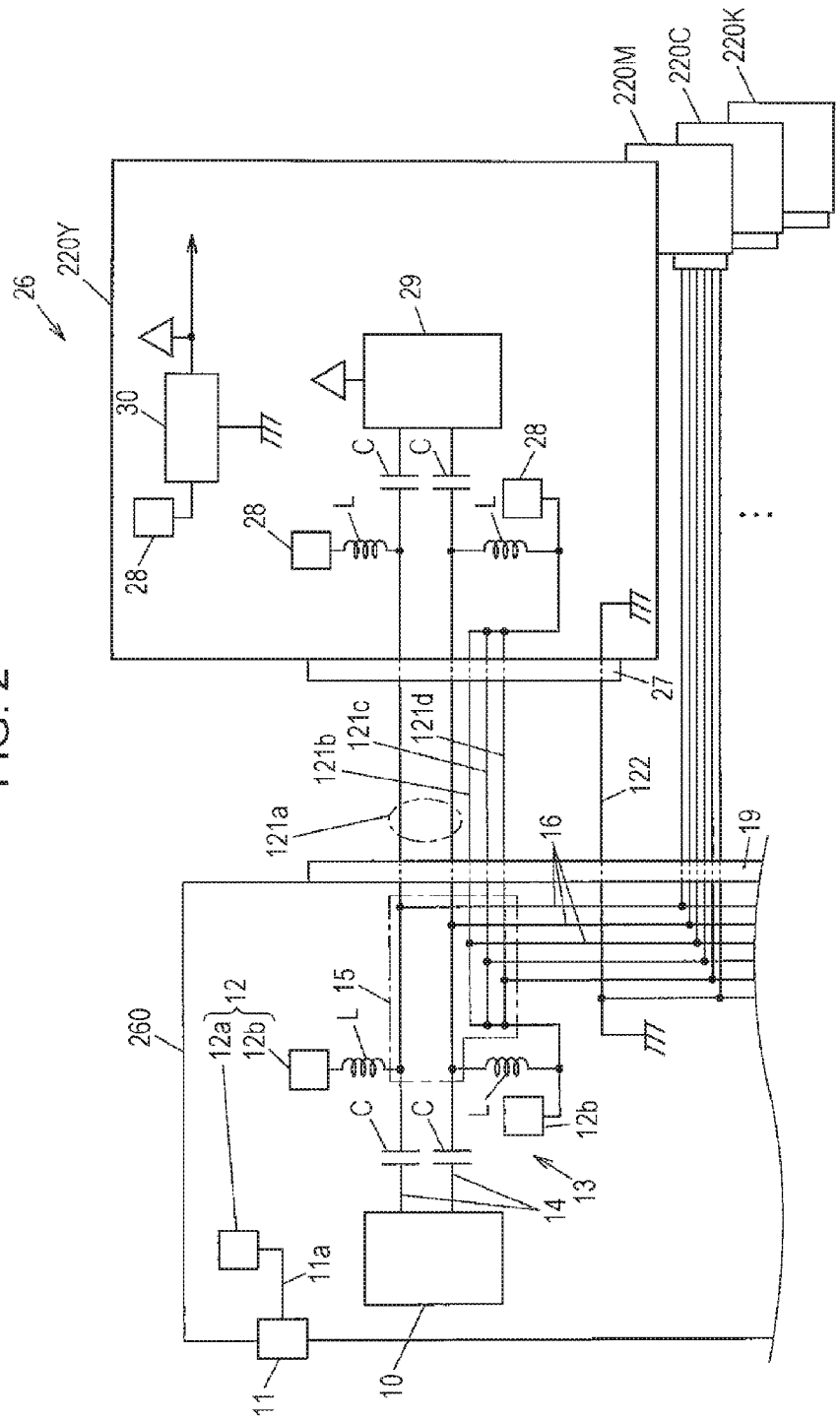
FIG. 2 is a diagram illustrating an example of an outline configuration of an image formation controller.
Figure 3:
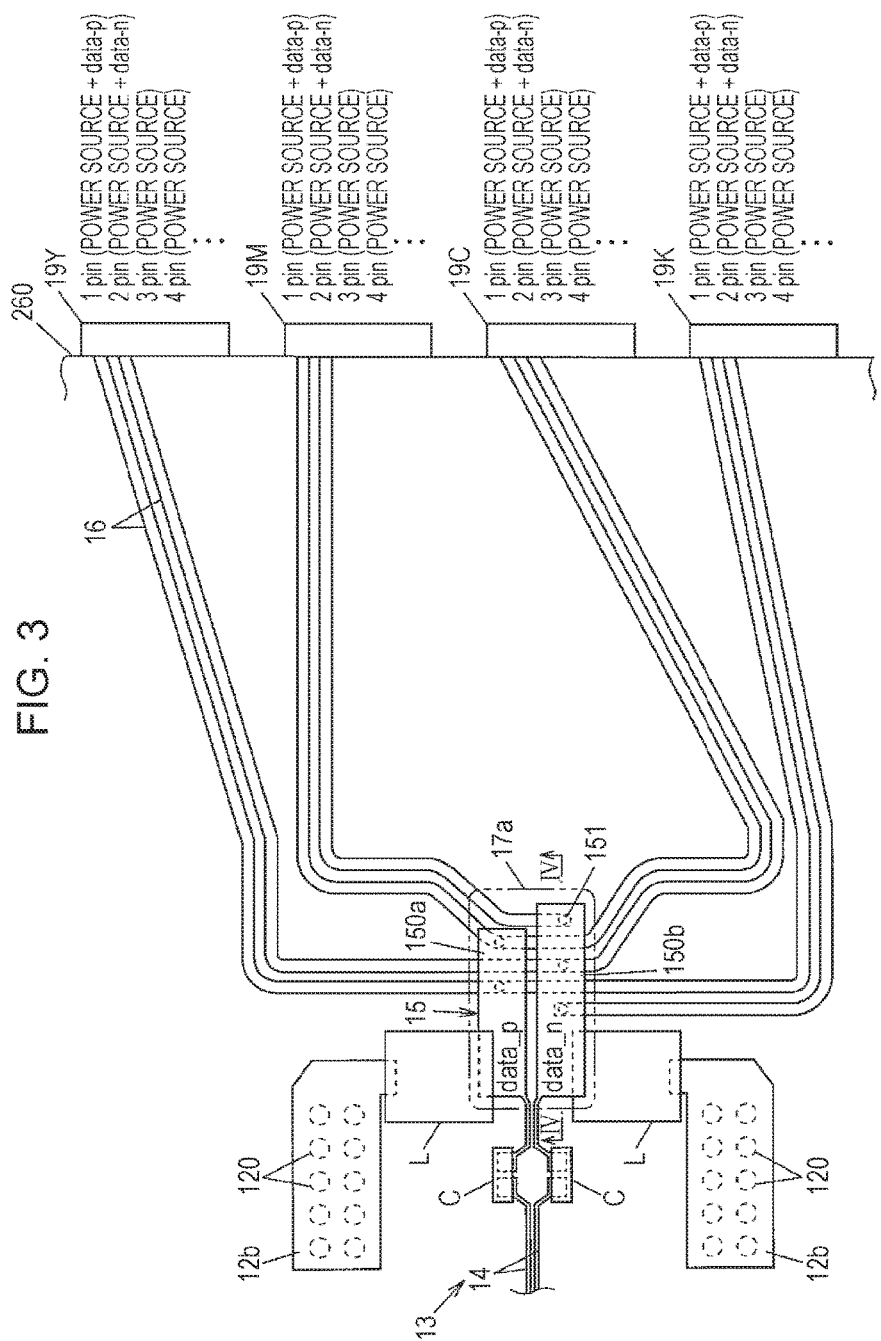
FIG. 3 is a plan view of a part of a controller board and illustrates details of a differential transmission path.
Figure 4:
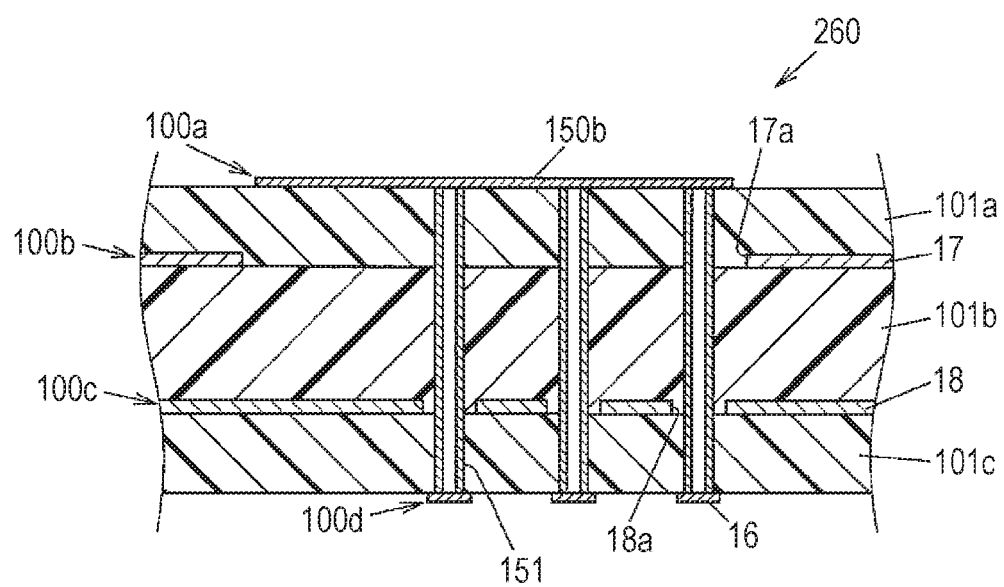
FIG. 4 is a cross-sectional view taken along line IV-IV of FIG. 3.

FIG. 2 is a diagram illustrating an example of an outline configuration of the image formation controller 26. FIG. 3 is a plan view of a part of the controller board 260 and illustrates details of a differential transmission path 13. FIG. 4 is a cross-sectional view taken along line IV-IV of FIG. 3. In FIG. 3, illustration of insulating layers 101a through 101c, a ground plane 17, and a ground/power plane 18 except an opening 17a of the ground plane 17 is omitted.

The controller board 260 and each of the LED substrates 220 are connected to each other by plural (four in the present exemplary embodiment) electric power branch lines 121a through 121d. The image formation controller 26 uses one of the plural electric power branch lines 121a through 121d, specifically the electric power branch line 121a as a differential transmission path and transmits a differential signal by superimposing the differential signal on the electric power branch line 121a. In FIG. 2, a ground line 122 is illustrated. Connecting the plural electric power branch lines 121a through 121d from the controller board 260 to the same LED substrate 220 makes it possible to supply electric power while reducing an electric current value per electric power branch line to a value that meets an allowable electric current value of a used connector or cable. In FIG. 2, connectors 19 and 27 are schematically illustrated.

The controller board 260 includes a signal generating section 10 that generates, from image data obtained by the image reading section (not illustrated) or from input data that includes control data and is externally input, a signal for exposure that controls the LPH 22, and an electric power line 12 to which electric power (e.g., 12 V) is supplied from a power input terminal 11. The signal generating section 10 is, for example, an application specific integrated circuit (ASIC) or a field programmable gate array (FPGA).

The signal generating section 10 transmits the generated signal for exposure to the LED substrates 220Y, 220M, 220C, and 220K by superimposing the signal for exposure on the electric power line 12 and the electric power branch line 121a. Power supply sections 12a and 12b of the electric power line 12 are exposed to a first layer 100a of the controller board 260. The signal for exposure is an example of a differential signal.

Each of the LED substrates 220Y, 220M, 220C, and 220K generates an LED driving signal on the basis of the signal for exposure transmitted from the controller board 260 and drives the LPH 22 by using the LED driving signal. In FIG. 2, a power supply section 28, an LED driving circuit (ASIC) 29 including a memory for an LED light amount adjustment parameter, and a DC-DC converter 30 for LED driving are also illustrated.

The differential transmission path 13 includes a pair of first lines 14 provided in the first layer 100a of the controller board 260, a coupling section 15 in which a pair of electric power lines 12 are coupled to the pair of first lines 14 and the pair of first lines 14 are branched, and plural pairs of second lines 16 that are provided in a fourth layer 100d of the controller board 260 and branch off in the coupling section 15. The first layer 100a is an example of one of plural layers.

The coupling section 15 is a section in which the electric power line 12 is coupled to the differential transmission path 13 and the first line 14 of the differential transmission path 13 is branched to the plural pairs of second lines 16. The coupling section 15 is provided in the first layer 100a and includes a pair of coupling lines 150a and 150b (collectively referred to as "coupling lines 150") having a width larger than the first line 14 and plural through-holes 151 that connect the pair of coupling lines 150a and 150b and the second lines 16.

As the second lines 16 and the electric power branch line 121a, through which an electric current of approximately 0.3 A flows, a copper foil having an impedance of 100Ω, a width of 0.34 mm, and a thickness of 0.035 mm is, for example, used. As the coupling lines 150, a copper foil having a width of 1.2 mm and a thickness of 0.035 mm is used so that an electric current of 1.2 A flows therethrough.

The controller board 260 is, for example, a printed board including four conductive layers. Alternatively, the controller board 260 may be a printed board including, for example, six conductive layers or eight conductive layers. The controller board 260 includes first through fourth layers 100a through 100d and insulating layers 101a through 101c each of which is interposed between adjacent two of the first through fourth layers 100a through 100d, as illustrated in FIG. 4. The insulating layers 101a through 101c are, for example, made of an insulating material such as a glass epoxy resin.

The second layer 100b is the ground plane 17 provided almost all over the second layer 100b. The ground plane 17 is an example of a conductive layer.

The third layer 100c is the ground/power plane 18 in which a ground plane and a power plane are provided. The ground/power plane 18 is a plane in which a power plane is provided at a necessary portion and a ground plane is provided around the power plane. Accordingly, the third layer 100c has, directly below the coupling section 15, openings 18a through which the though-holes 151 pass.

The ground plane 17 of the second layer 100b has an opening 17a that encompass the coupling section 15 in plan view. This secures a distance between the coupling lines 150 and the ground/power plane 18 in the third layer 100c, thereby making it possible to increase the impedance in the coupling lines 150. For example, assume that the thickness of the insulating layer 101a between the first layer 100a and the second layer 100b is 0.2 mm and the thickness of the insulating layer 101b between the second layer 100b and the third layer 100c is 1 mm. In a case where the ground plane 17 does not have the opening 17a, the impedance in the coupling line 150 is approximately 43Ω and a reflected wave is generated by impedance mismatch, assuming that a dielectric constant of the insulating layers 101a through 101c is 4.2. Meanwhile, according to the present exemplary embodiment, the impedance in the coupling line 150 may be increased to approximately 100Ω thanks to the opening 17a of the ground plane 17, and it is therefore possible to suppress occurrence of a reflected wave caused by impedance mismatch.

The power supply section 12b is connected to the first line 14 via a coil L so that a differential signal is not transmitted to the power supply section 12b side. A capacitor C for removing a direct-current component is inserted in the first line 14. The power input terminal 11 is connected to the power supply section 12a via the electric power line 11a provided in the first layer, the power supply section 12a is connected to the ground/power plane 18 via a through-hole (not illustrated), and the ground/power plane 18 is connected to the power supply section 12b via a through-hole 120.

Modification 1

Figure 5:
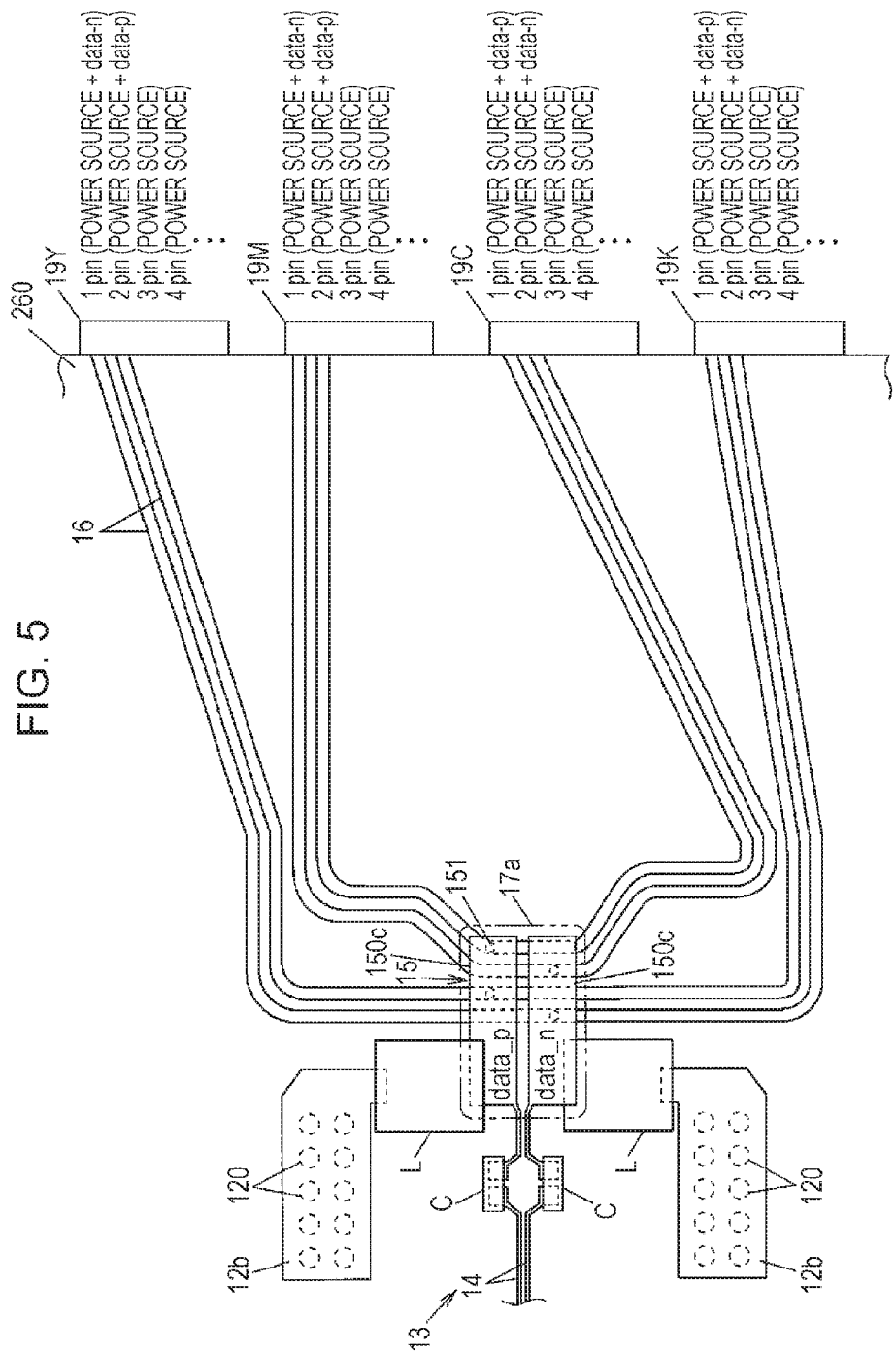
FIG. 5 is a plan view of a part of a controller board according to Modification 1 of FIG. 3.

FIG. 5 is a plan view of a part of a controller board according to Modification 1 of FIG. 3. The pair of coupling lines 150a and 150b illustrated in FIG. 3 connect eight second lines 16 through five through-holes 151. Meanwhile, in Modification 1, a pair of coupling lines 150c connect eight lines 16 through four through-holes 151. This makes the length of the pair of coupling lines 150 shorter than that in the case illustrated in FIG. 3. This makes it possible to reduce a branch wiring region, thereby contributing to a reduction in size of the board.

Modification 2

Figure 6:
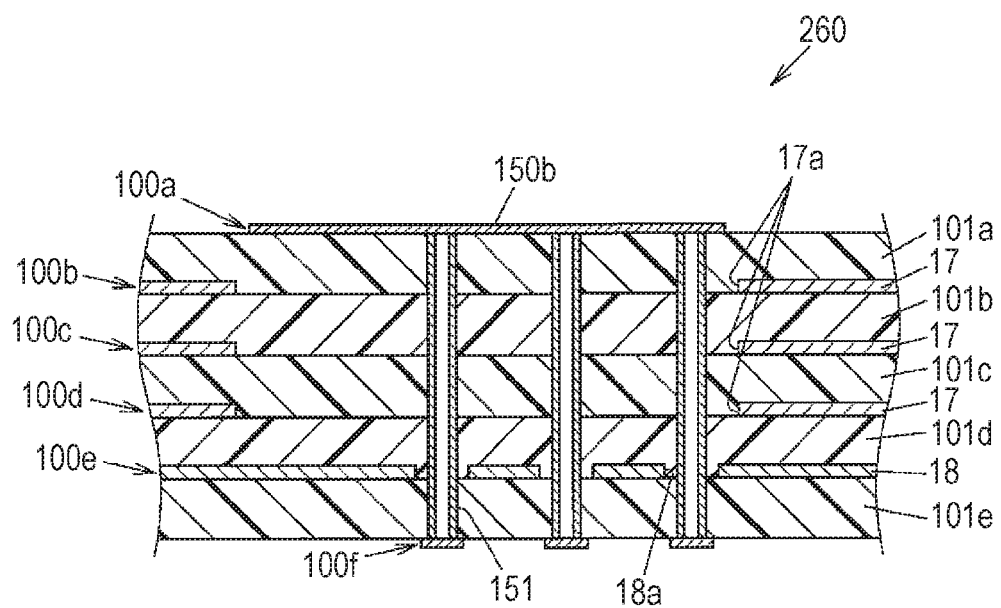
FIG. 6 is a cross-sectional view of a part of a controller board according to Modification 2 of FIG. 4.

FIG. 6 is a cross-sectional view of a part of a controller board according to Modification 2 of FIG. 4. The controller board 260 illustrated in FIG. 4 has a four-layer structure. Meanwhile, the controller board according to Modification 2 has a six-layer structure. Coupling lines 150 are provided in a first layer 100a, a ground plane 17 is provided in a second layer 100b, a third layer 100c, and a fourth layer 100d, a ground/power plane 18 is provided in a fifth layer 100e, and a second line 16 is provided in a sixth layer 100f.

Each of the ground planes 17 provided in the second layer 100*b*, third layer 100*c*, and fourth layer 100*d* has an opening 17*a* that encompasses the coupling lines 150 in plan view. The thickness of each of the insulating layers 101*a* through 101*e* becomes smaller as the number of layers of the controller board increases. In view of this, the opening 17*a* is provided not only in the ground plane 17 provided in the second layer 100*b*, but also in the ground planes 17 provided in the third layer 100*c* and the fourth layer 100*d* in order to increase the impedance in the coupling lines.

Note that the exemplary embodiment of the present invention is not limited to the exemplary embodiment described above and can be modified in various ways without departing from the spirit of the present invention. For example, in the above exemplary embodiment, a printed board including a ground plane in a second layer and a ground/power plane in a third layer is described as a controller board. Alternatively, the controller board may be a printed board including a power plane, a ground/power plane, or a wiring plane in a second layer and a ground/power plane or a wiring plane in a third layer. In this case, the conductive layer in the second layer has an opening for increasing impedance.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A signal transmitting apparatus comprising:
a first line that is provided in one of a plurality of layers of a board and is configured to transmit a signal by superimposing the signal on an electric power line that supplies electric power;
a coupling section in which the electric power line is coupled to the first line and the first line is branched;
a plurality of second lines that branch off in the coupling section and are provided in another layer different from the one layer; and
a conductive layer that is provided between the one layer and the other layer,
wherein the conductive layer has an opening that encompasses the coupling section in plan view, and
wherein the coupling section has a coupling line that has a larger width than the first line and a plurality of through-holes that connect the coupling line and the plurality of second lines through the opening of the conductive layer.

2. A signal transmitting apparatus comprising:
a pair of first lines that are provided in one of a plurality of layers of a board and are configured to transmit a differential signal by superimposing the differential signal on a pair of electric power lines that supply electric power;
a coupling section in which the pair of electric power lines are coupled to the pair of first lines and the pair of first lines are branched;
a plurality of pairs of second lines that branch off in the coupling section and are provided in another layer different from the one layer; and
a conductive layer that is provided between the one layer and the other layer,
wherein the conductive layer has an opening that encompasses the coupling section in plan view, and
wherein the coupling section has a pair of coupling lines that have a width larger than the pair of first lines and a plurality of through-holes that connect the pair of coupling lines and the plurality of pairs of second lines through the opening of the conductive layer.

3. An image forming apparatus including the signal transmitting apparatus according to claim 1, comprising:
a plurality of exposure devices for a respective plurality of colors;
a control board configured to generate a signal for exposure for controlling the exposure devices from image data or input data that includes control data and is externally input; and
a plurality of drive substrates configured to generate a driving signal for driving the exposure devices from the signal for exposure,
wherein the control board is configured to transmit the signal for exposure to the plurality of drive substrates by superimposing the signal for exposure on the electric power line.

* * * * *